United States Patent [19]

Simpson

[11] Patent Number: 4,528,549
[45] Date of Patent: Jul. 9, 1985

[54] BIPOLAR DIGITIZER HAVING COMPRESSION CAPABILITY

[75] Inventor: James E. Simpson, Albuquerque, N. Mex.

[73] Assignee: The United States of America as represented by the Secretary of the Air Force, Washington, D.C.

[21] Appl. No.: 461,426

[22] Filed: Jan. 27, 1983

[51] Int. Cl.³ .............................................. H03K 13/20
[52] U.S. Cl. ........................ 340/347 AD; 340/347 SH
[58] Field of Search ................. 340/347 AD, 347 SH, 340/347 NT

[56] References Cited

U.S. PATENT DOCUMENTS

| | | | |
|---|---|---|---|
| 3,507,647 | 1/1976 | Waehmer | 340/347 AD |
| 3,631,468 | 12/1971 | Spaid | 340/347 AD |
| 3,678,505 | 7/1972 | Mostyn, Jr. | 340/347 |
| 3,688,221 | 8/1972 | Fruhale | 340/347 AD UX |
| 3,737,893 | 6/1973 | Belet et al. | 340/347 |
| 3,737,897 | 6/1973 | Geoffrey | 340/347 AD |
| 3,878,534 | 4/1975 | Horwitz et al. | 340/347 |
| 3,909,824 | 9/1975 | Fontanes | 340/347 |
| 4,191,942 | 3/1980 | Long | 340/347 |
| 4,229,730 | 10/1980 | Huntington | 340/347 |

Primary Examiner—Charles D. Miller
Attorney, Agent, or Firm—Donald J. Singer; Richard J. Donahue

[57] ABSTRACT

A bipolar digitizer (A/D converter) is disclosed which uses a single comparator circuit for initially determining the polarity of a sampled input signal and for thereafter comparing the absolute magnitude of the signal to an applied ramp voltage. The time required for the ramp voltage to exceed the magnitude of the sampled input signal is converted into a digital waveform representative of the magnitude of the sampled input signal. Resistive means are selectively connected in shunt with a signal storage capacitor to achieve bipolar signal compression and increased dynamic range.

8 Claims, 7 Drawing Figures

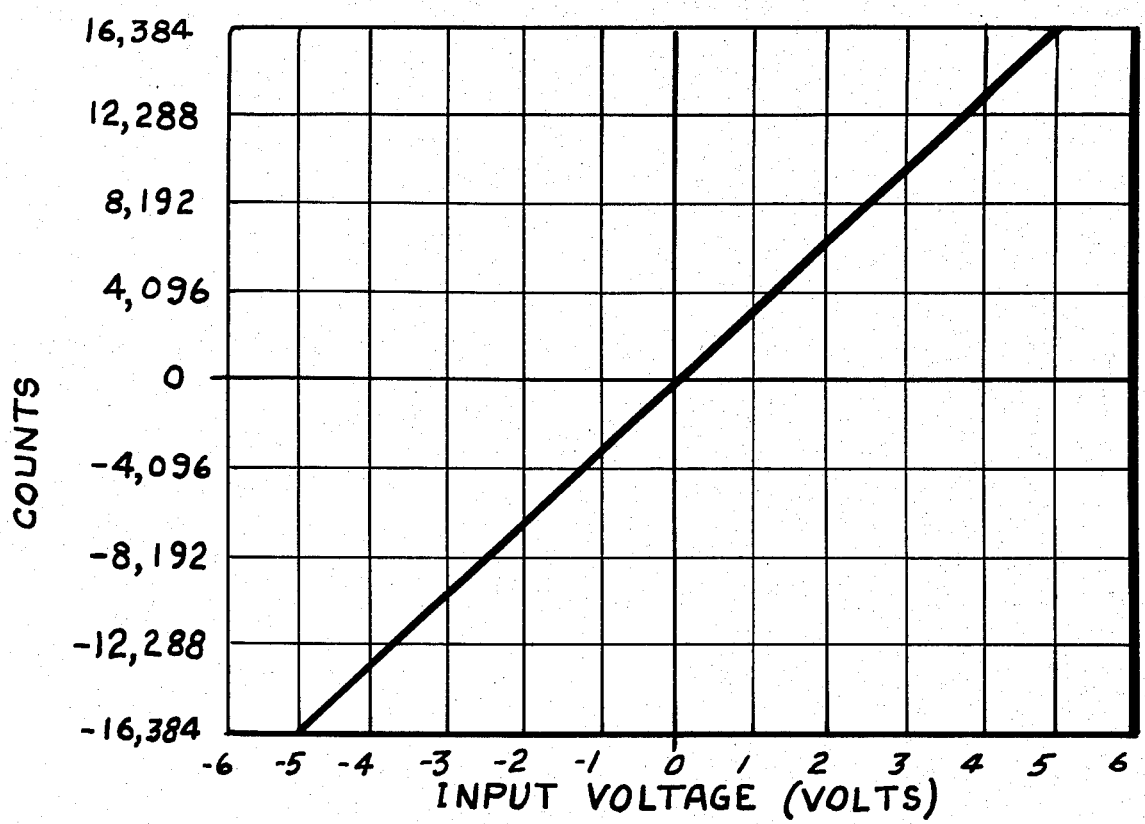

BIPOLAR DIGITIZER HAVING COMPRESSION CAPABILITY

STATEMENT OF GOVERNMENT INTEREST

The invention described herein may be manufactured and used by or for the Government for governmental purposes without the payment of any royalty thereon.

BACKGROUND OF THE INVENTION

This invention relates generally to electronic signal processing circuitry and in particular to an improved bipolar digitizer or analog to digital converter capable of accepting analog input signals of either polarity and providing quantized digital representations of such signals.

Numerous applications exist which require that analog signals be digitized for further processing and analysis by computers or the like. One instance of the need for such apparatus occurs in security alarm systems of the type which utilize a buried cable, such as a Miles cable, as the intrusion sensing device. Seismic stimuli resulting from the disturbance of the soil in the vicinity of the cable or magnetostrictive stimuli resulting from ferrous material brought into close proximity to the cable are each sufficient to generate electrical signals in the cable. With the aid of a digital signal processor, it becomes possible to characterize these signals with sufficient accuracy to discern certain unique digital signatures formed by human footsteps etc., intruding upon the security alarm system.

In seeking an analog to digital converter capable of adequately interfacing the Miles cable to a digital processor, it was found that commercially available devices of this type were deficient in one or more respects thus rendering them unsuitable for this application. Some, for example, were found to be incapable of processing bipolar signals. Others attained the required resolution at conversion rates much too low to support the aforementioned signal processing application. And still others could not handle a wide range of input voltage levels or were insensitive to low input voltage levels.

SUMMARY OF THE INVENTION

It is therefore a primary object of the present invention to provide an analog to digital converter capable of processing bipolar input signals and having improved crossover characteristics and stability with small input signals.

It is another object of the present invention to provide such a converter having a desired signal compression capability simultaneous with bipolar symmetry.

It is a further object of this invention to provide a bipolar digitizer which is economical to produce and utilizes conventional solid-state components that lend themselves to standard mass production techniques.

These and other objects, advantages and features are achieved in the following circuit arrangement. A sample and hold circuit receives and periodically stores discrete voltage segments of an applied analog input signal. A determination is then made of the polarity of the stored voltage to establish the counting direction of an up/down digital counter. If necessary, the polarity of the stored voltage is inverted to assure that a positive polarity voltage is applied to one input of a voltage comparator circuit. A linearly-rising ramp voltage is then applied to the other input of the comparator and a digital counting process is initiated. The counting process continues until the magnitude of the ramp voltage exeeds the magnitude of the stored voltage. At this time the counting process is terminated, an end-of-conversion signal is generated and the digital count established in the up/down counter is made available to associated computer apparatus for analysis.

Signal compression, when desired, is accomplished by shunting the storage capacitor of the sample and hold circuit with an appropriate value of resistance. The magnitude of the stored signal diminishes exponentially with time thereby causing low-level signals to be accorded a greater weight than high-level inputs.

BRIEF DESCRIPTION OF THE DRAWINGS

FIG. 3 is a graph depicting the response characteristics of the bipolar digitizer when operated in its linear mode; and FIG. 4 is a graph depicting the response characteristics of the bipolar digitizer when operated in its signal compression mode.

DETAILED DESCRIPTION OF THE INVENTION

Figure 1:
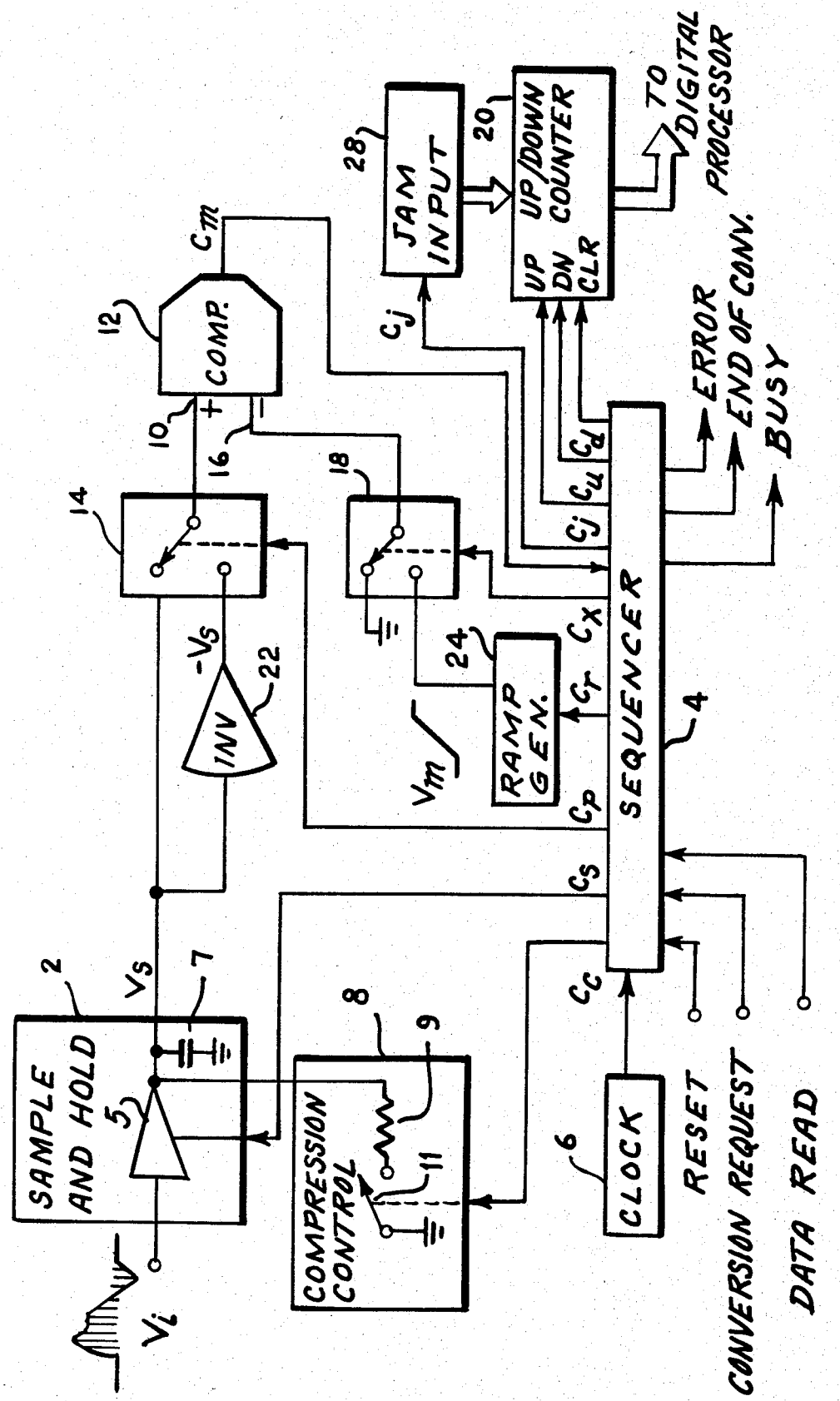
FIG. 1 is a functional block diagram, partially schematic, of a bipolar digitizer embodying the present invention.

Generally, the bipolar digitizer of FIG. 1 comprises a sample and hold circuit 2 which receives an analog input signal, such as the signal Vi. The sampling duration and rate are determined by control pulses Cs applied to sample and hold circuit 2 from a sequencer unit 4 under control of a clock unit 6. Each sampled voltage level of input signal Vi is passed through an amplifier 5 and is thereafter temporarily stored in a capacitor 7.

Since the input signal Vi may have a wide dynamic range, it is often necessary to provide a means for compressing this signal to expand the storage capacity of the system. Moreover, when compressing the input signal, it is desireable to accord greater weight to the lower-level signals. To this end there is provided a compression control circuit 8 which consists essentially of a resistor 9 which is connected in shunt with capacitor 7 in response to the closure of a switching device 11. Switch 11 is activated by a signal Cc applied to the compression control circuit 8 via sequencer 4.

Having stored a voltage Vs representative of the sampled portion of input signal Vi, it is now necessary to determine its polarity. This is accomplished by coupling the voltage Vs to one input terminal 10 of a comparator 12 via switching unit 14. Switching unit 14 is shown functionally in the drawing as a single pole-double throw switch operated by a control signal Cp derived from sequencer 4. The other input terminal 16 of comparator 12 is, at this time, maintained at zero volts by connecting it to a ground reference point via a switching unit 18. Switching unit 18 is shown functionally in the drawing as a single pole-double throw switch operated by a control signal Cx derived from sequence 4.

As previously mentioned, the invention can be constructed with commercially available solid state components. Sample and hold circuit 2, for example can be formed with the use of integrated circuit SMP-10 available from Precision Monolithics Incorporated. Comparator 12 may be constructed with PMI circuit CMP-01 while switching units 14 and 18 may each be formed from a pair of PMI SW-02 switches.

An output signal Cm having one of two voltage levels is derived from comparator 12 and is applied to sequencer 4. If it is determined from the level of signal Cm that the sampled voltage Vs is positive, then switch 14 remains in the condition depicted in the drawing whereby the positive signal Vs is directly applied to input terminal 10 of comparator 12. Sequencer unit 4 now provides a control signal Cu to the Up input of an up/down counter 20 to condition the latter to its positive counting mode of operation. If, on the other hand, it is determined from the level of signal Cm that Vs is negative, a signal Cp is generated by sequencer 4 causing switch 14 to assume its second state whereby signal Vs is inverted by inverter unit 22 prior to its application to input 10 of comparator 12. In addition, sequencer 4 generates a control signal Cd which is applied to the Dn input of up/down counter 20 to condition the latter to its negative counting mode of operation.

Having determined the polarity of input signal Vi for the particular sampling interval, a ramp voltage generator 24 is activated by a control signal Cr applied thereto from sequencer 4. A control signal Cx is also provided by sequencer 4 causing the ramp voltage waveform Vm to be applied to input 16 of comparator 12.

Upon enabling of the ramp voltage generator, a counting process is initiated in up/down counter 20 which continues until the ramp voltage exceeds the sampled voltage and causes a transition in the signal Cm, or until a full count of the up/down counter is attained. If the magnitude of signal Vs or −Vs is within the established conversion range, the sequencer 4 then provides an end-of-conversion signal. Alternatively, if a full count of the up/down counter 20 is reached prior to a transition in signal Cm, the sequencer circuit 4 then stops the conversion, injects a full-scale count into the up/down counter 20 via control signal Cj and jam input circuit 28, and provides an error signal in conjunction with the end-of-conversion signal. The purpose for inserting a full-scale count in counter 20 upon the occurrence of the aforementioned error condition is to avoid a condition where counter 20 begins to recycle and thereby provides an erroneous low value digital count. By storing a full count into counter 20, the digital processor can be instructed or configured to either accept and use this maximum value, which more accurately represents the input signal magnitude, or ignore this value entirely upon receipt of an error signal.

After completion of a sampling interval, the digital information stored in counter 20 is transferred to further circuitry adapted to characterize and process the digital data. The binary digitizer is then reset to await a further conversion request.

A preferred circuit embodiment of the invention formed of commercially available semiconductor components is depicted in FIGS. 2A–2D. Each component has been given a unit designation (e.g., A3, U5) and the signal terminal numbers are provided thereon. Control signals associated with the analog section shown in FIG. 2A have been assigned appropriate functional legends which are identified below.

Figure 2A:
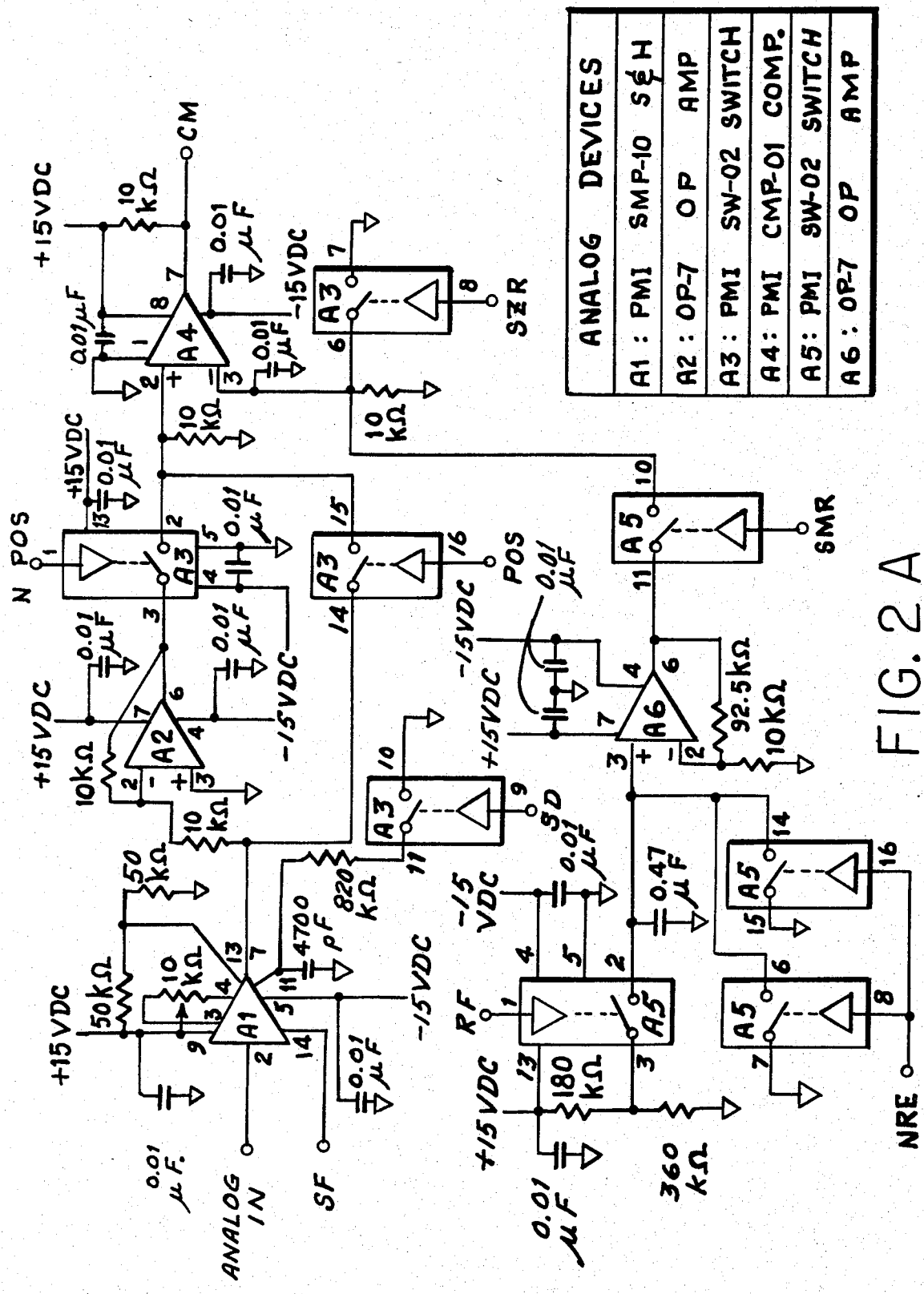
FIGS. 2A, 2B, 2C and 2D, when combined, provide a detailed schematic drawing of a preferred embodiment of the present invention.
Figure 2B:
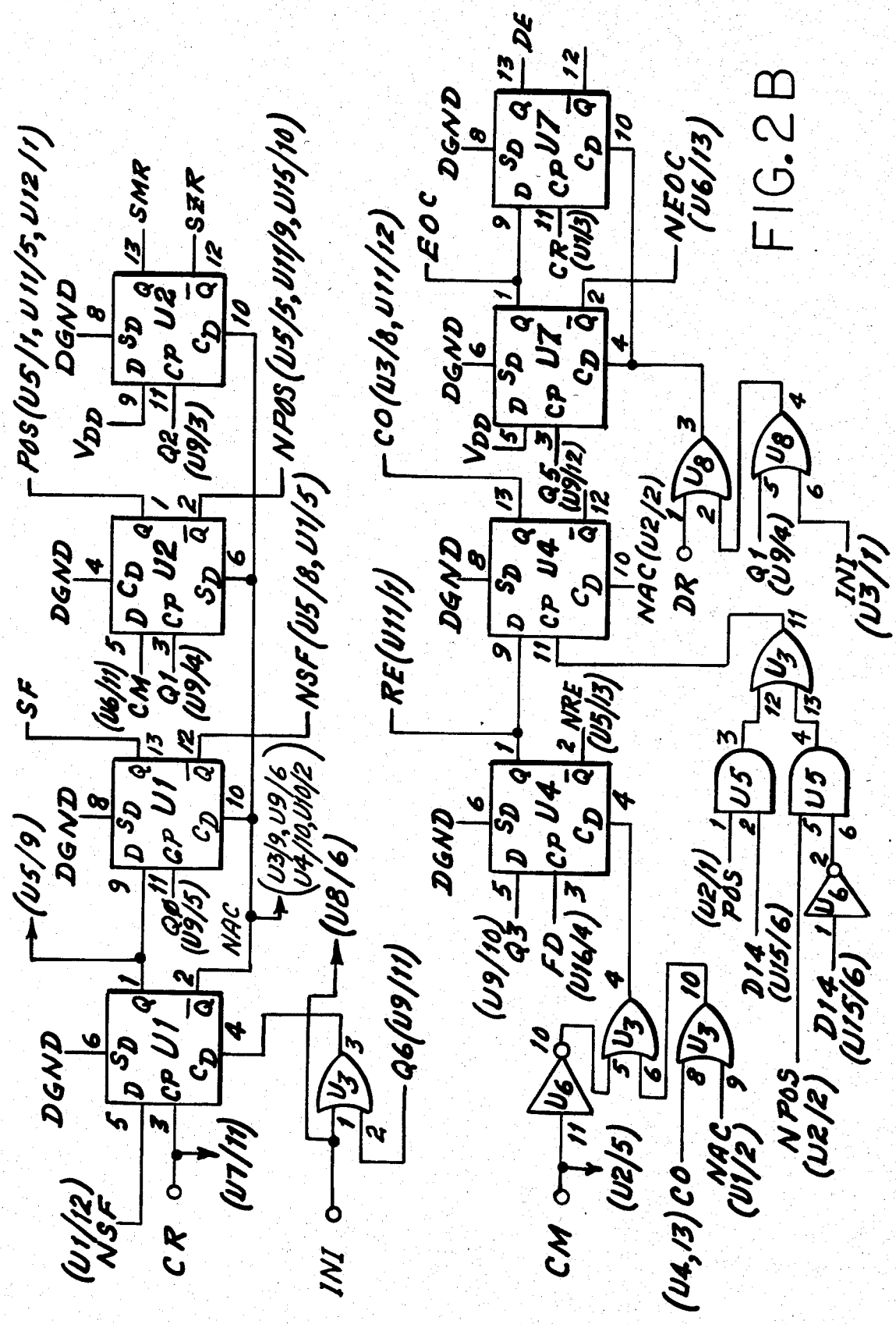
Figure 2C:
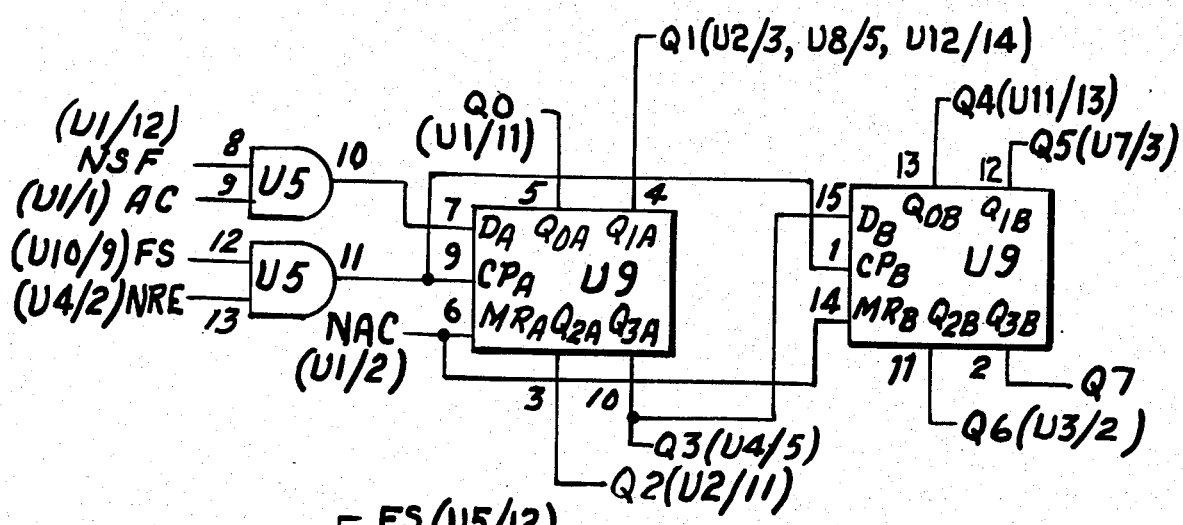
Figure 2C:
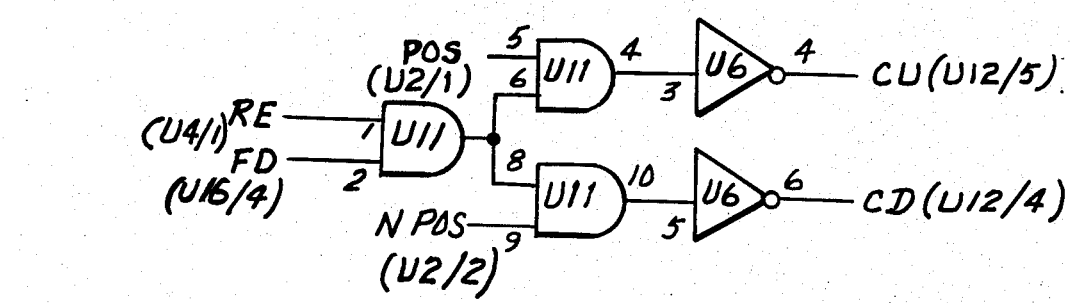
Figure 2C:
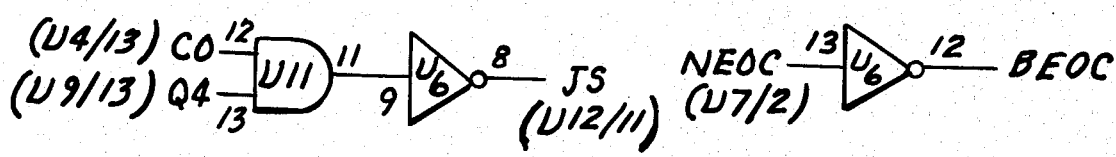
Figure 2D:
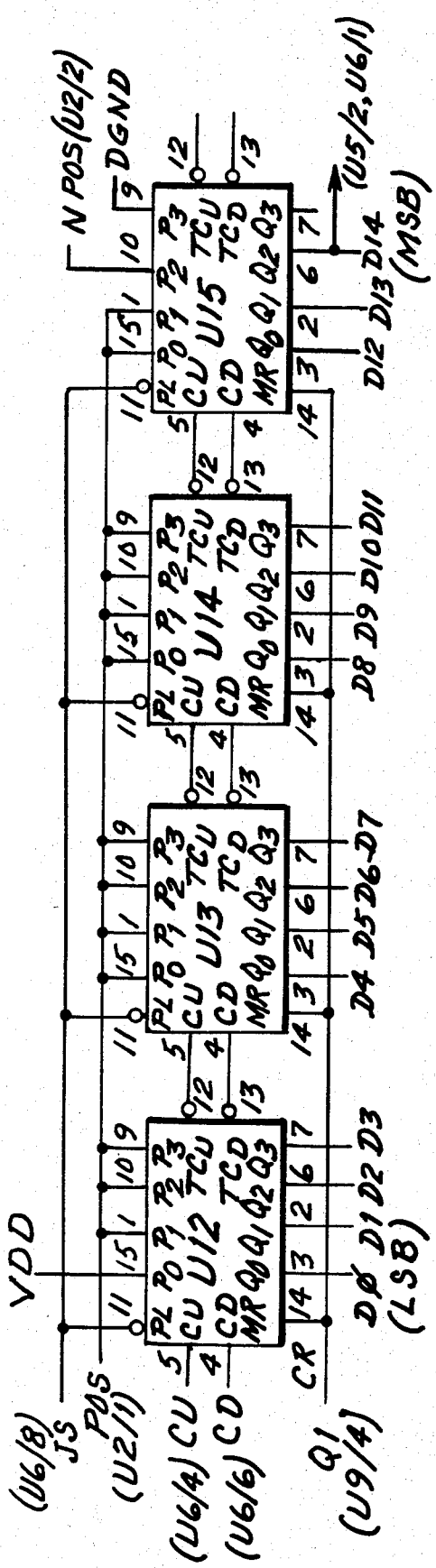
Figure 2D:
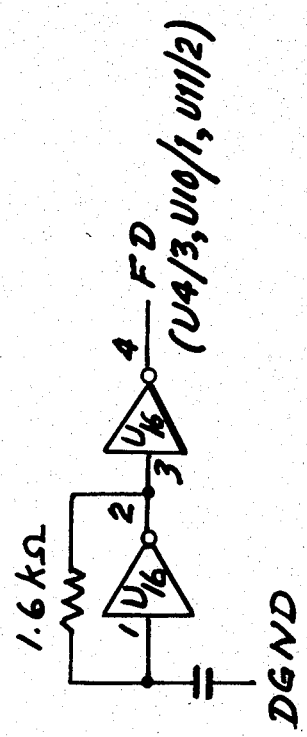

The interconnection of the signal leads in the digital section of the invention depicted in FIGS. 2B–2D can be determined from the unit and terminal designations provided within the parentheses. For example, the designation (U5/9) associated with terminal 1 of unit 1 indicates that this terminal is to be connected to unit 5, terminal 9.

In the analog section, sample and hold unit A1 captures a sample of the input at pin 2 on demand from the sample freeze (SF) control signal issued from the digital sequencer/controller to be described below. Initially, the sampler output at A1-7 (unit A1, pin 7) is routed through A3-(14, 15) to the A4 comparator which is referenced to zero via A3-(6, 7) activated by the select-zero-reference (SZR) control signal. The comparator output (CM) at A4-7 directs the sequencer/controller to leave the positive (POS) control signal asserted if the analog sample ($V_S$) is greater than or equal to zero. If not, not positive (NPOS) is asserted to direct an inverted version of the sample to the comparator via A3-(3, 2) activated by the NPOS control line.

Next, the sequencer initiates the approximate ramp by deasserting NRE (not-ramp-enable) and asserting RE. The time constant of the resistor divider feeding A5-(3, 2) and the 0.47 microfarad capacitor is about 20 times the maximum conversion interval which provides a ramp with about ±5% accuracy/linearity. The gain of A6 is adjusted such that the ramp will intersect a maximum amplitude input signal sample at the desired maximum conversion time. When the ramp intersects the sample version at A4-2, a transition of CM (A4-7) steps the controller out of the conversion state and stops the digitizing counters (U12–U15) which began counting coincident with the assertion of RE.

Referring now to the digital section of the invention shown in FIGS. 2B–2D, the sequencer is built around a state generator provided by a shift register (U9). An initialize (INI) signal at U3-1 causes a not-active (NAC) level to be asserted at U1-2, and clears error flags at U7 via an input at U8-6. NAC then forces the state generator to State 0 (all zeros).

Only when INI is deasserted will a conversion request (CR) be recognized at U1-3 to generate an active (AC) level at U1-1. For this working model, a simple unstabilized 6 MHz clock source at U16-4 was used which was voltage sensitive but exhibited very little jitter. This digitizing frequency (FD) was divided down to provide a sequencing frequency (FS) at U10-9. It should be noted that NAC is used at U10-2 to synchronize FS with CR within one period of FD.

Thus, with the sample freeze (FS) not asserted and AC asserted, a "one" level is provided at the shift register input, U9-7 and with ramp enable (RE) not asserted, FS is active at U9-9 which allows the state generator (U9) to change to State 1 (Q0=1) after one period of FS. This delay assures that the sample and hold (A1) will have at least one FS period to acquire a new sample between subsequent conversions.

The leading edge of Q0 at U1-11 causes the sample freeze (SF) control line to be asserted; and at the same time, NSF is deasserted at U5-8 to prevent additional "ones" from being shifted into the state generator.

After another period of FS to allow the sampler to settle, the state generator changes to State 2 (Q1=1). Using the output of the comparator (A4) at U2-5, the leading edge of Q1 at U2-3 causes POS to be deasserted and NOPS to be asserted only if CM is deasserted to establish the proper control signals for a negative analog input.

Again, after a period of FS for circuit settling, the state generator changes to State 3 (Q2=1) with the leading edge of Q2 at U2-11 changing the states of SMR and SZR to switch the comparator reference from zero to the ramp source.

Now with the analog and digital circuits configured to convert the sampled signal, State 4 (Q3=1) is used to qualify the converting signal RE at U4-5. The next leading edge of FD at U4-3 then asserts RE at U4-1 to initiate the ramp source in the analog module and provide count-up (CU) or countdown (CD) signals for the up-down counter (UDC) (U12-U15) at U6-4 or U6-6 as established by the polarity signals (POS and NPOS) at U11-5 and U11-9.

It should be noted that in the conversion state (State 4), the clock inputs to the State generator U9-1 and U9-9 are inhibited by a deasserted NRE at U5-13. Thus, the state generator will remain quiescent until NRE is reasserted. This can happen from two different sources.

If the analog sample is nonzero, CM is normally asserted going into State 4. As soon as the ramp source is equal to the sample value, CM will drop at U6-11 to provide a clear signal at U4-4 as the first source. The second source comes from a counter overflow (CO) signal at U3-8 which is generated by the overflow detector controlled by D14 (U15-6) of the UDC and supplied at U4-13.

The counter overflow flag (CO) performs three main functions. First, it is used to terminate the conversion process by deasserting RE which allows the state generator to shift to State 5 (Q4=1). Second, it enables a UDC jam strobe (JS) at U11-12 and last, the flag can be useful to a processor to indicate that digitizer overrange has happened.

State 5 is used to adjust the UDC in case of overrange with the leading edge of Q4 at U11-13 used to generate a PL signal to U12-U15 which side loads full-scale counts into the UDC depending on the state of POS and NPOS.

At the next FS, the state generator shifts to State 6 (Q5=1); and Q5 is used at U7-3 to announce the end-of-conversion by asserting EOC at U7-1 which indicates that converted (or adjusted) data is available at D0-D14, and arms a missed-data-error flag at U7-9.

The final sequencer state, State 7 (Q6=1) takes the system to the initial state when Q6 at U3-2 deasserts AC and asserts NAC which readies the device for the next CR. The conversion data remains valid until a Q1 level is asserted at U12-14 to clear the UDC for a new conversion. If a data acknowledge (DR) signal has not been received prior to Q1, a missed-data-error flag will be asserted at U7-13 for optional use.

FIG. 3 illustrates the linear response of the bipolar digitizer while FIG. 4 depicts the response of the digitizer when the value of the resistor in the compression control circuit is selected to provide 6 db of compression. It will be seen that the compression circuitry is effective in this instance to double the range of response to input signals applied to this device while favoring the response of low level input signals. In both the linear and compressed modes of operation, bipolar symmetry is achieved.

While there have been described the fundamental and unique features of my invention as applied to a preferred embodiment, various other embodiments, variations, adaptations, substitutions, additions, omissions, and the like may occur to, and can be made by, those of ordinary skill in the art, without departing from the spirit of the invention. For example, the compression control circuit 8 might be expanded to include additional resistors as well as reactive elements which are selectively switched in shunt with capacitor 7 to provide further signal compression characteristics.

What is claimed is:

1. Signal processing apparatus comprising:
   sample and hold means for sampling and temporarily storing discrete voltage segments of an applied analog signal waveform,
   said sample and hold means including a capacitor for temporarily storing said discrete voltage segments,
   ramp generator means for providing a linearly-rising ramp voltage waveform,
   signal inversion means connected to the output of said sample and hold means,
   single comparator means coupled to said sample and hold means and to said ramp generator means for initially determining the polarity of a stored voltage segment of said analog signal waveform and for thereafter providing an output indication when the magnitude of said ramp voltage waveform exceeds the absolute magnitude of said stored voltage segment,
   first switch means for initially connecting the output of said sample and hold means to a first input terminal of said comparator means, and for thereafter connecting the output of said signal inversion means to said first input terminal when the said stored voltage segment has a negative value,
   second switch means for initially connecting a ground reference potential to a second input terminal of said comparator means to determine the polarity of said stored voltage segment and for thereafter coupling said ramp voltage waveform to said second input terminal of said comparator means,
   and digital counting means responsive to the output of said comparator means for providing a digital pulse waveform representative of the time required for said ramp voltage to exceed the absolute magnitude of said stored voltage segment.

2. The apparatus of claim 1 and further comprising:
   impedance means shunting said capacitor whereby the magnitude of said stored voltage segment diminishes exponentially with time.

3. The apparatus of claim 2 wherein said impedance means is a resistor.

4. The apparatus of claim 1 and further comprising:
   means for establishing and maintaining a maximum count in said digital counting means when the absolute value of said stored voltage segment exceeds the maximum value of said ramp voltage waveform.

5. The apparatus of claim 4 and further comprising:
   resistive means connected in shunt with said capacitor.

6. A bipolar analog to digital comparator comprising:
   a sample and hold circuit including a signal storage capacitor,
   a ramp voltage generator,
   a comparator having first and second inputs and an output,
   a signal inverter connected to the output of said sample and hold circuit,
   a first switch selectively connecting either the output of said sample and hold circuit or the output of said signal inverter to the first input of said comparator,
   a second switch selectively connecting either a ground reference potential or said ramp voltage generator to the second input of said comparator.

a sequencer circuit controlling the operation of said first and said second switch and receiving output signals from said comparator, and a digital up/down counter coupled to said sequencer circuit.

7. The apparatus of claim 6 and further comprising:

a resistor connected in shunt with said signal storage capacitor.

8. The apparatus of claim 7 and further comprising:

a jamming circuit connected to said digital up/down counter for establishing and maintaining a full count therein.

* * * * *